United States Patent
Denison et al.

(10) Patent No.: US 8,643,099 B2
(45) Date of Patent: Feb. 4, 2014

(54) INTEGRATED LATERAL HIGH VOLTAGE MOSFET

(71) Applicant: Texas Instruments Incorporated, Dallas, TX (US)

(72) Inventors: Marie Denison, Plano, TX (US); Sameer Pendharkar, Allen, TX (US); Philip L. Hower, Concord, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/922,381

(22) Filed: Jun. 20, 2013

(65) Prior Publication Data

US 2013/0277739 A1 Oct. 24, 2013

Related U.S. Application Data

(62) Division of application No. 13/284,011, filed on Oct. 28, 2011, now Pat. No. 8,476,127.

(60) Provisional application No. 61/407,809, filed on Oct. 28, 2010.

(51) Int. Cl.
*H01L 29/78* (2006.01)
(52) U.S. Cl.
USPC ..... 257/335; 257/336; 257/492; 257/E29.012
(58) Field of Classification Search
USPC .......... 257/327, 328, 335–337, 492, E29.012, 257/E29.256
See application file for complete search history.

(56) References Cited

U.S. PATENT DOCUMENTS

| | | | | |
|---|---|---|---|---|
| 5,907,173 A * | 5/1999 | Kwon et al. | | 257/336 |
| 6,528,849 B1 * | 3/2003 | Khemka et al. | | 257/342 |
| 7,238,986 B2 * | 7/2007 | Pendharkar et al. | | 257/336 |
| 7,309,896 B2 * | 12/2007 | Kim | | 257/355 |
| 7,495,286 B2 * | 2/2009 | Lee | | 257/340 |
| 7,581,286 B2 * | 9/2009 | Choi | | 15/352 |
| 8,067,801 B2 * | 11/2011 | Matsudai et al. | | 257/336 |
| 8,252,652 B2 * | 8/2012 | Chang et al. | | 438/286 |
| 2008/0093641 A1 * | 4/2008 | Ludikhuize et al. | | 257/343 |
| 2012/0187485 A1 * | 7/2012 | Morioka | | 257/343 |

* cited by examiner

*Primary Examiner* — Tuan N. Quach
(74) *Attorney, Agent, or Firm* — Wade J. Brady, III; Frederick J. Telecky, Jr.

(57) ABSTRACT

An integrated circuit containing a dual drift layer extended drain MOS transistor with an upper drift layer contacting a lower drift layer along at least 75 percent of a common length of the two drift layers. An average doping density in the lower drift layer is between 2 and 10 times an average doping density in the upper drift layer. A process of forming an integrated circuit containing a dual drift layer extended drain MOS transistor with a lower drift extension under the body region and an isolation link which electrically isolates the body region, using an epitaxial process. A process of forming an integrated circuit containing a dual drift layer extended drain MOS transistor with a lower drift extension under the body region and an isolation link which electrically isolates the body region, on a monolithic substrate.

8 Claims, 8 Drawing Sheets

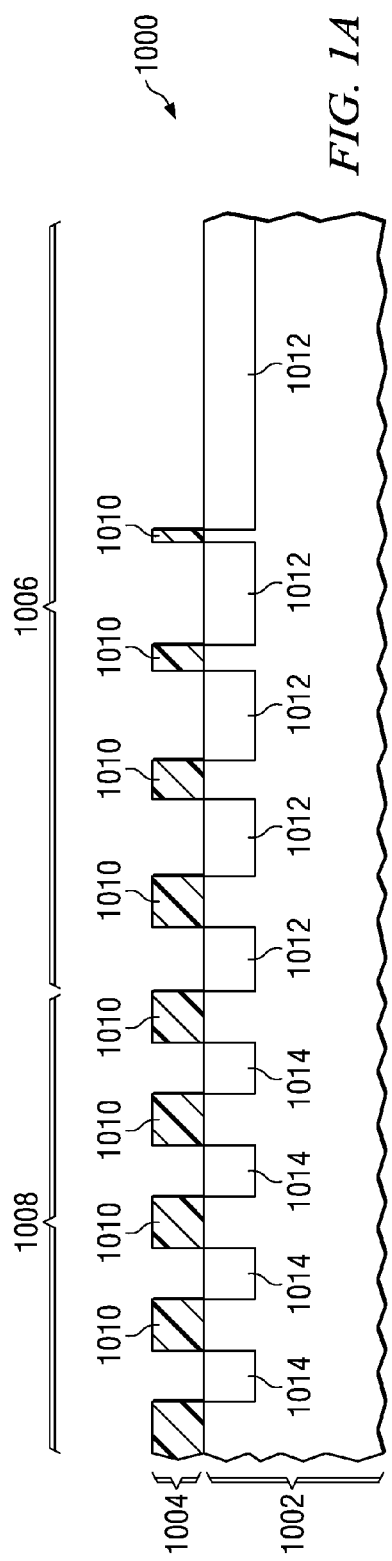
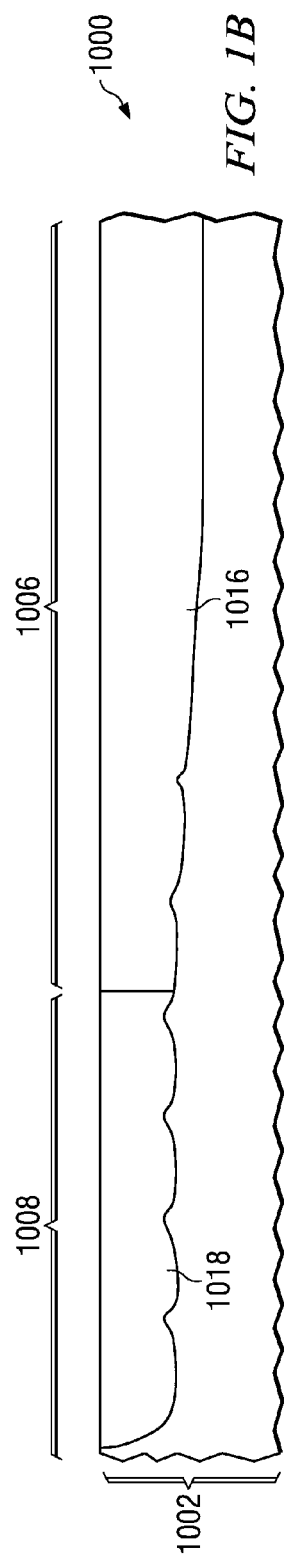

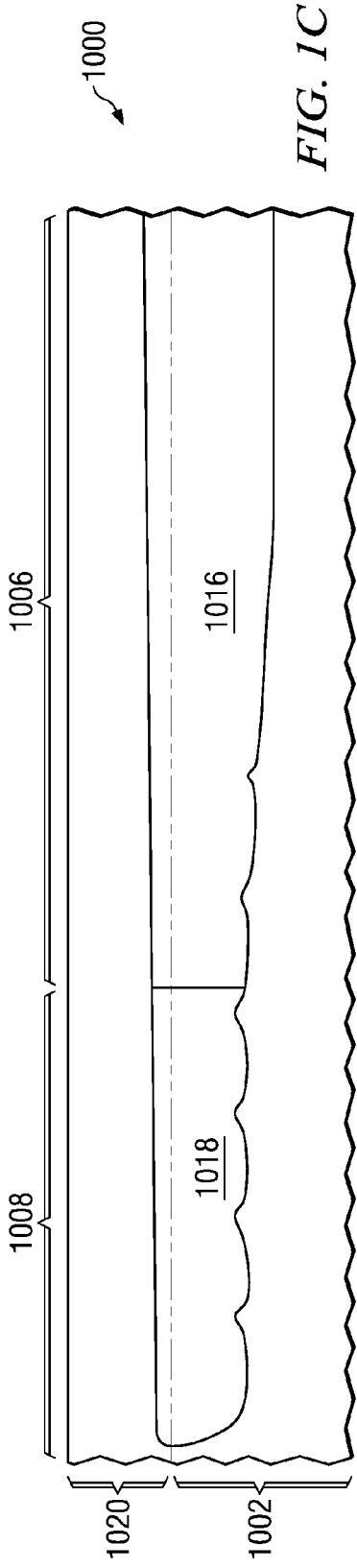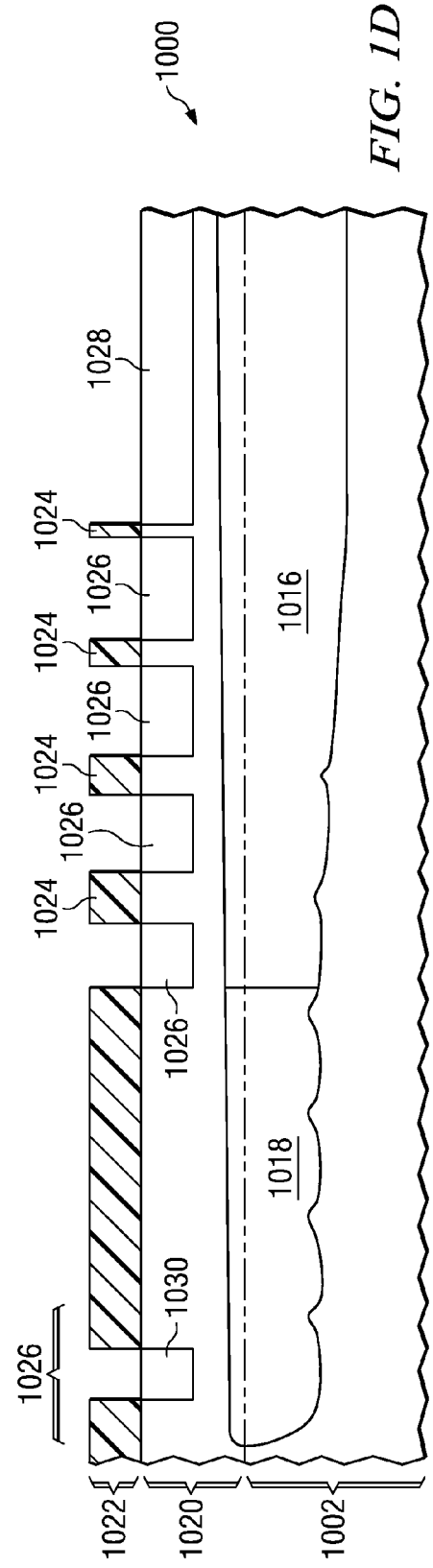

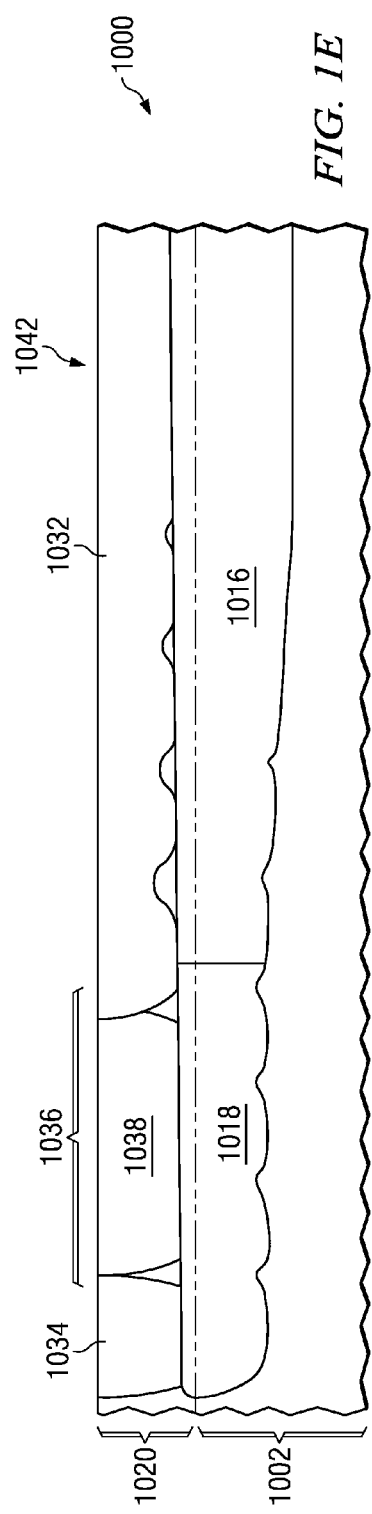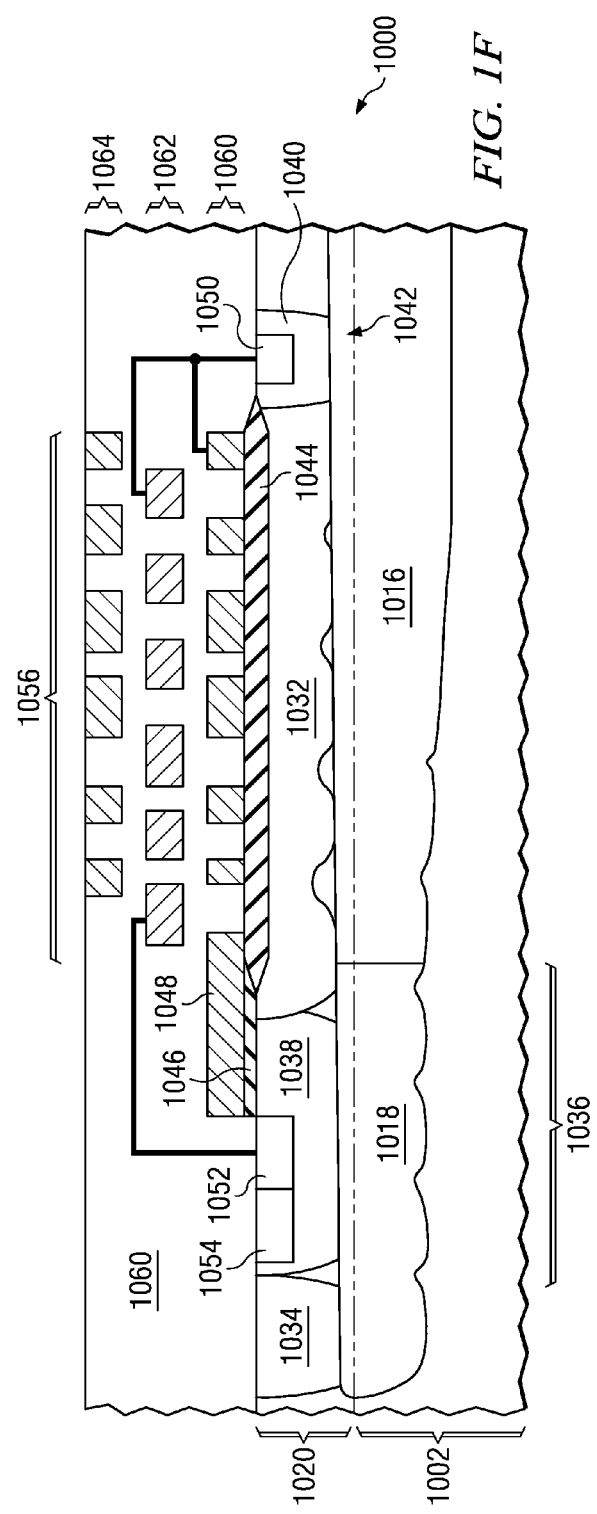

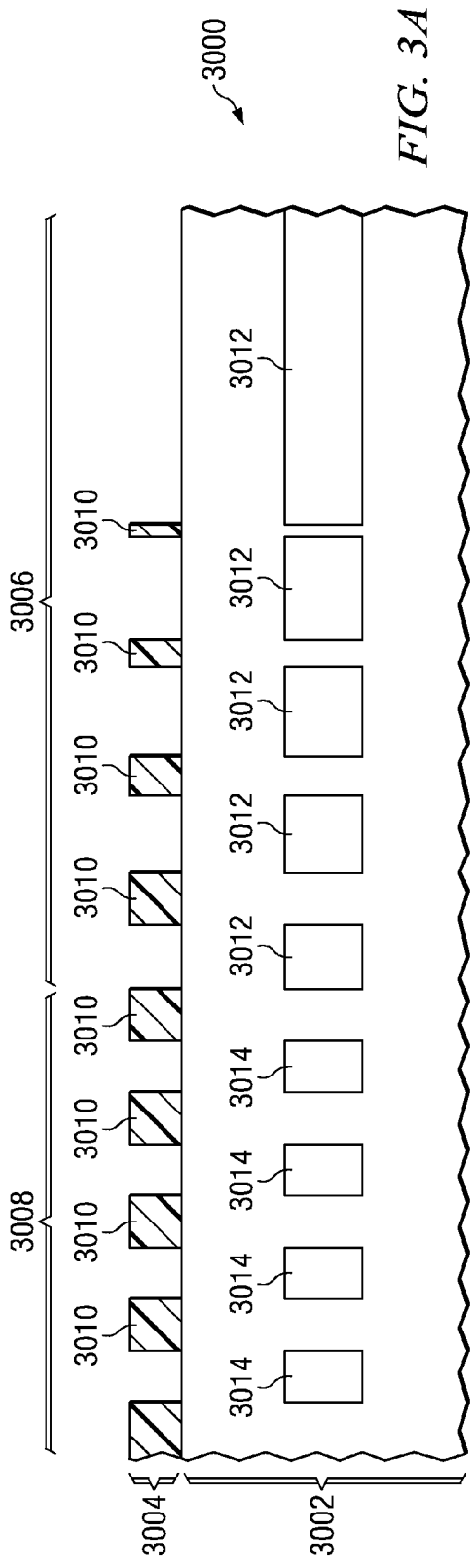
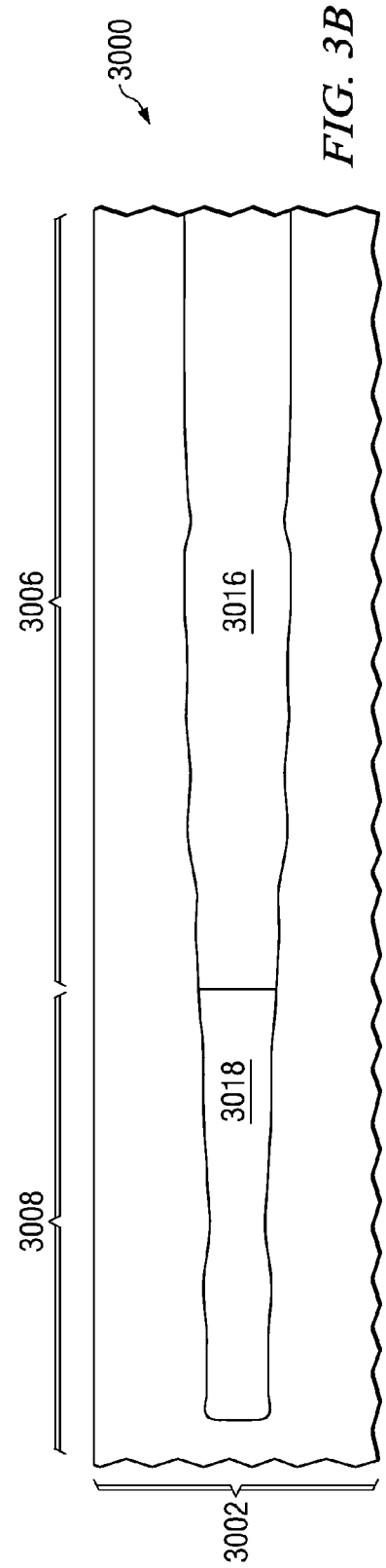

US 8,643,099 B2

INTEGRATED LATERAL HIGH VOLTAGE MOSFET

This application is a Divisional of U.S. patent application Ser. No. 13/284,011, filed Oct. 28, 2011, now U.S. Pat. No. 8,476,127, which claims the benefit of U.S. Provisional Application No. 61/407,809, filed Oct. 28, 2010, the entirety of which is herein incorporated by reference.

FIELD OF THE INVENTION

This invention relates to the field of integrated circuits. More particularly, this invention relates to extended drain MOS transistors in integrated circuits.

BACKGROUND OF THE INVENTION

An integrated circuit may include a lateral extended drain metal oxide semiconductor (MOS) transistor, for example to switch or regulate a voltage higher than that used to power logic circuits in the integrated circuit. An extended drain MOS transistor includes a drift region in the extended drain which contributes to the area and series resistance of the extended drain MOS transistor. It may be desirable to reduce an area of the extended drain MOS transistor which provides a desired series resistance and operating drain voltage.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may contain a dual drift layer extended drain MOS transistor, including an upper drift layer contacting a lower drift layer along at least 75 percent of a common length of the upper drift layer and the lower drift layer. An average doping density in the lower drift layer is between 2 and 10 times an average doping density in the upper drift layer. In an embodiment, the average doping density in the upper drift layer is between $5 \times 10^{15}$ cm$^{-3}$ and $5 \times 10^{16}$ cm$^{-3}$ and the average doping density in the lower drift layer is between $1 \times 10^{16}$ cm$^{-3}$ and $5 \times 10^{17}$ cm$^{-3}$. In one embodiment, the lower drift layer may be formed by introducing dopants into a lower drift area in a substrate, followed by epitaxial growth of a semiconductor layer on the substrate and formation of the upper drift layer in the epitaxial layer. In another embodiment, the lower drift layer and the upper drift layer may be formed by ion implanting dopants into a monolithic substrate at sufficient energies to attain desired depths for the lower drift layer and the upper drift layer. The lower drift layer may be diluted proximate to the channel of the extended drain MOS transistor, by segmenting the ion implant mask or diffusion mask used to form the lower drift layer.

In one embodiment, the lower drift layer may be extended under the body region of the extended drain MOS transistor and contacted by an isolation link to electrically isolate the source and body from the substrate. The extended portion of the lower drift layer may be diluted by segmenting the ion implant mask or diffusion mask to provide a desired punch-through voltage between the body and the substrate.

DESCRIPTION OF THE VIEWS OF THE DRAWING

FIG. 1A through FIG. 1F are cross-sections of an integrated circuit containing a dual drift layer extended drain MOS transistor, formed according to an embodiment, depicted in successive stages of fabrication.

FIG. 3A through FIG. 3C are cross-sections of an integrated circuit containing a dual drift layer extended drain MOS transistor, formed according to an alternate embodiment, depicted in successive stages of fabrication.

DETAILED DESCRIPTION

Figure 2A:
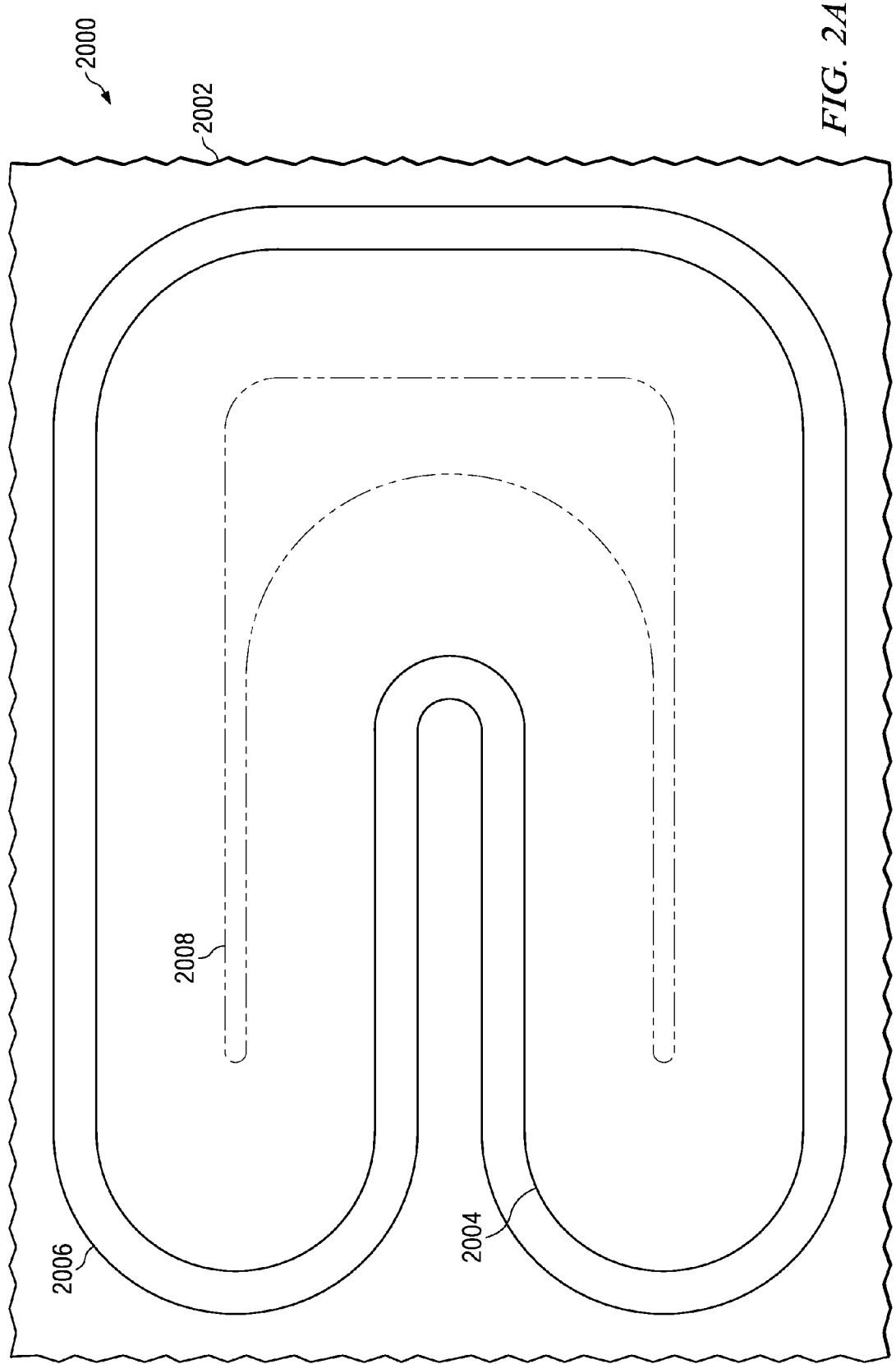
FIG. 2A and FIG. 2B are top views of an integrated circuit containing a dual drift layer extended drain MOS transistor, formed according to an embodiment, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this description, the term "substantially equal" is understood to mean equal within manufacturing tolerances or unintended variations encountered during fabrication of embodiments.

FIG. 1A through FIG. 1F are cross-sections of an integrated circuit containing a dual drift layer extended drain MOS transistor, referred to hereafter as the MOS transistor, formed according to an embodiment, depicted in successive stages of fabrication. The instant embodiment will be described for an n-channel MOS transistor; it will be recognized that a p-channel MOS transistor may be fabricated with appropriate changes of polarities of conductivity types and dopants. Referring to FIG. 1A, the integrated circuit 1000 is formed in and on a p-type semiconductor substrate 1002 such as a single crystal silicon wafer, a hybrid orientation technology (HOT) wafer with regions of different crystal orientations, or other semiconductor material appropriate for fabrication of the integrated circuit 1000. A lower drift layer implant mask 1004 is formed over the substrate 1002 to expose a top surface of the substrate 1002 in a lower drift layer area 1006 and possibly in a lower drift extension area 1008. The lower drift layer implant mask 1004 may be segmented in the lower drift layer area 1006 with blocking elements 1010 as depicted in FIG. 1A, or may be free of blocking elements 1010 so as to expose all the top surface of the substrate 1002 in the lower drift layer area 1006. Similarly, the lower drift layer implant mask 1004 may be segmented with blocking elements 1010 in the lower drift extension area 1008, if formed, as depicted in FIG. 1A, or may be free of blocking elements 1010 so as to expose all the top surface of the substrate 1002 in the lower drift extension area 1008. The lower drift layer implant mask 1004 may be formed of photoresist, or of dielectric material such as silicon dioxide by patterning and etching a layer of the dielectric material. A lower drift layer ion implant operation is performed on the integrated circuit 1000 which implants n-type lower drift layer dopants through the lower drift layer implant mask 1004 into the substrate 1002 to form a lower drift layer implanted region 1012 in the lower drift layer area 1006. If blocking elements 1010 are present in the lower drift layer area 1006, the lower drift layer implanted region 1012 may be segmented, as depicted in FIG. 1A. The lower drift layer ion implant operation also forms a lower drift extension implanted region 1014 in the lower drift extension area 1008 if the lower drift layer implant mask 1004 exposes the substrate 1002 in the lower drift extension area 1008. The lower drift extension implanted region 1014 may also be segmented if blocking elements 1010 are present in the lower drift extension area 1008. The lower drift layer implant mask 1004 may be removed after the lower drift layer ion implant operation is completed.

Referring to FIG. 1B, a lower drift layer drive operation is performed on the integrated circuit 1000 which heats the substrate 1002, for example above 1000° C. for at least 10 minutes, so as to diffuse the lower drift layer dopants in the lower drift layer implanted region 1012 to form an n-type lower drift layer 1016 in the lower drift layer area 1006. If the lower drift extension implanted region 1014 was formed, the lower drift layer drive operation diffuses the lower drift layer dopants in the lower drift extension implanted region 1014 to form an n-type lower drift extension 1018 in the lower drift extension area 1008. The lower drift extension 1018, if formed, is continuous with the lower drift layer 1016. Segmenting the lower drift layer implanted region 1012 may reduce a local average doping density in a segmented portion of the lower drift layer 1016 compared to an undiluted portion. Similarly, segmenting the lower drift extension implanted region 1014 may reduce a local average doping density in a segmented portion of the lower drift extension 1018 compared to an undiluted portion.

Referring to FIG. 1C, a p-type epitaxial layer 1020 is formed on a top surface of the substrate 1002. The epitaxial layer 1020 may be formed, for example, in a vapor phase epitaxial process by thermal decomposition of tetrachlorosilane in hydrogen between 1150° C. and 1250° C., or by thermal decomposition of silane between 625° C. and 675° C. The lower drift layer 1016 and the lower drift extension 1018 if present may expand into a lower portion of the epitaxial layer 1020, as depicted in FIG. 1C.

Referring to FIG. 1D, an upper drift layer implant mask 1022 is formed over the epitaxial layer 1020 to expose a top surface of the epitaxial layer 1020 above the lower drift layer 1016 and possibly in an isolation link area 1026 above the lower drift extension 1018. The upper drift layer implant mask 1022 may be segmented above the lower drift layer 1016 with blocking elements 1024 as depicted in FIG. 1D, or may be free of blocking elements 1024 so as to expose all the top surface of the substrate 1002 over the lower drift layer 1016. The upper drift layer implant mask 1022 may be formed of photoresist or dielectric material such as silicon dioxide, as described in reference to the lower drift layer implant mask of FIG. 1A. An upper drift layer ion implant operation is performed on the integrated circuit 1000 which implants n-type upper drift layer dopants through the upper drift layer implant mask 1022 into the epitaxial layer 1020 above the lower drift layer 1016 to form an upper drift layer implanted region 1028. If blocking elements 1024 are present above the lower drift layer 1016, the upper drift layer implanted region 1028 may be segmented, as depicted in FIG. 1D. If the isolation link area 1026 is present in the upper drift layer implant mask 1022, the upper drift layer ion implant operation forms an isolation link implanted region 1030 above the lower drift extension 1018. The upper drift layer implant mask 1022 may be removed after the upper drift layer ion implant operation is completed.

Referring to FIG. 1E, an upper drift layer anneal operation is performed on the integrated circuit 1000 which heats the epitaxial layer 1020, for example above 1000° C. for at least 60 seconds, so as to diffuse the upper drift layer dopants in the upper drift layer implanted region 1028 to form an n-type upper drift layer 1032 which contacts an upper surface of the lower drift layer 1016 along at least 75 percent of a common length of the upper drift layer 1032 and the lower drift layer 1016. Segmenting the upper drift layer implanted region 1028 may reduce a local average doping density in a segmented portion of the upper drift layer 1032 compared to an undiluted portion. If the isolation link implanted region 1030 is present, the upper drift layer anneal operation diffuses the upper drift layer dopants in the isolation link implanted region 1030 to form an isolation link 1034 which contacts the lower drift extension 1018 and electrically isolates a body region 1036 of the dual drift layer MOS transistor. An average doping density of the isolation link 1034 is substantially equal to, or within 25 percent of, an average doping density of the upper drift layer 1032. The body region 1036 is located adjacent to the upper drift layer 1032 opposite from a drain section 1042 of the dual drift layer MOS transistor. A p-type body well 1038 may be formed in the body region 1036, for example by ion implanting p-type dopants such as boron into the body region 1036 and subsequently annealing the integrated circuit 1000.

An average doping density in the lower drift layer 1016 is between 2 and 10 times an average doping density in the upper drift layer 1032. A local average doping density in an undiluted portion of the lower drift layer 1016 may be between $1 \times 10^{16}$ cm$^{-3}$ and $5 \times 10^{17}$ cm$^{-3}$. An average doping density in an undiluted portion of the upper drift layer 1032 may be between $5 \times 10^{15}$ cm$^{-3}$ and $5 \times 10^{16}$ cm$^{-3}$.

Referring to FIG. 1F, an optional n-type drain link 1040 may be formed in the upper drift layer 1032 at the drain section 1042 of the dual drift layer MOS transistor. The drain link 1040 may be formed for example by ion implanting n-type dopants into the upper drift layer 1032 in the drain section 1042, and subsequently annealing the integrated circuit 1000.

An optional field oxide layer 1044 may be formed at the top surface of the epitaxial layer 1020 over the upper drift layer 1032. The field oxide 1044 may be formed of silicon dioxide between 250 and 600 nanometers thick, for example by shallow trench isolation (STI) or local oxidation of silicon (LOCOS) processes.

A gate dielectric layer 1046 is formed on a top surface of the epitaxial layer 1020 over the body region 1036 and overlapping the upper drift layer 1032. The gate dielectric layer 1046 may be one or more layers of silicon dioxide, silicon oxynitride, aluminum oxide, aluminum oxy-nitride, hafnium oxide, hafnium silicate, hafnium silicon oxynitride, zirconium oxide, zirconium silicate, zirconium silicon oxy-nitride, a combination of the aforementioned materials, or other insulating material. The gate dielectric layer 1046 may include nitrogen as a result of exposure to a nitrogen containing plasma or a nitrogen containing ambient gas at temperatures between 50 C and 800 C. The gate dielectric layer 1046 may be between 3 and 10 nanometers thick. The gate dielectric layer 1046 may be formed by any of a variety of gate dielectric formation processes, for example thermal oxidation, plasma nitridation of an oxide layer, and/or dielectric material deposition by atomic layer deposition (ALD). A gate 1048 is formed on the gate dielectric layer 1046 above the body region 1036 and overlapping the upper drift layer 1032. The gate 1048 may be one or more layers of polycrystalline silicon, commonly referred to as polysilicon, metal silicide such as tungsten silicide, titanium silicide, cobalt silicide, or nickel silicide, or metal such as tungsten, titanium nitride, or tungsten nitride.

An n-type drain contact region 1050 is formed in the in the upper drift layer 1032 in the drain section 1042, in the drain link 1040 if present. The drain contact region 1050 may be formed for example by forming a drain contact implant mask, ion implanting n-type dopants through the mask into the upper drift layer 1032 in the drain section 1042, and subsequently annealing the integrated circuit 1000. An n-type source region 1052 is formed in the body region 1036 adjacent to the gate 1048. The source region 1052 is formed in a similar manner to, and possibly concurrently with, the drain contact region 1050. A p-type body contact region 1054 is formed in the body region 1036. The body contact region 1054 may be formed for example by forming a body contact implant mask, ion implanting p-type dopants through the mask into the body region 1036, and subsequently annealing the integrated circuit 1000. In one version of the instant embodiment, the drain contact region 1050, the source region 1052 and the body contact region 1054 may have an average doping density above $1 \times 10^{18}$ cm$^{-3}$.

In one version of the instant embodiment, a doping density of the lower drift layer 1016 proximate to the body region 1036 may be diluted so that a local average doping density of the lower drift layer 1016 proximate to the body region 1036 is less than 50 percent of a local doping density of the lower drift layer 1016 proximate to the drain section 1042. Diluting the doping density of the lower drift layer 1016 proximate to the body region 1036 may advantageously reduce an area of the MOS transistor required to provide a desired series resistance and drain operating voltage.

In one version of the instant embodiment, a doping density of the lower drift extension 1018 may be diluted so that a local average doping density of the lower drift extension 1018 is less than 50 percent of a local doping density of the lower drift layer 1016 proximate to the drain section 1042. Diluting the doping density of the lower drift extension 1018 may advantageously increase a punch-through voltage of the body region 1036 to the substrate 1002 outside the MOS transistor.

In one version of the instant embodiment, a doping density of the upper drift layer 1032 proximate to the body region 1036 may be diluted so that a local average doping density of the upper drift layer 1032 proximate to the body region 1036 is less than 50 percent of a local doping density of the upper drift layer 1032 proximate to the drain section 1042. Diluting the doping density of the upper drift layer 1032 proximate to the body region 1036 may advantageously reduce an area of the MOS transistor required to provide a desired series resistance and drain operating voltage.

An optional segmented field plate 1056 may be formed over the upper drift layer 1032 in a set of dielectric layers 1058 which support interconnects of the integrated circuit 1000. The segmented field plate 1056 may include any combination of gate level segments 1060, first metal level segments 1062 and second metal level segments 1064. The segments 1060, 1062 and 1064 may be floating or biased. In one version of the instant embodiment, channel end segments of the gate level segments 1060 and the first metal level segments 1062 may be electrically connected to the gate 1048 and/or source region 1052, drain end segments may be electrically connected to the drain contact region 1050, and interior segments floated, as depicted in FIG. 1F. The segmented configuration may provide a stepped or graduated potential along the segmented field plate 1056, which may advantageously reduce a peak electric field in the upper drift layer 1032. The first metal level segments 1062 if formed may overlap, be edge aligned with, or be recessed from the gate level segments 1060. Similarly, the second metal level segments 1064 if formed may overlap, be edge aligned with, or be recessed from the first metal level segments 1062.

Figure 2B:
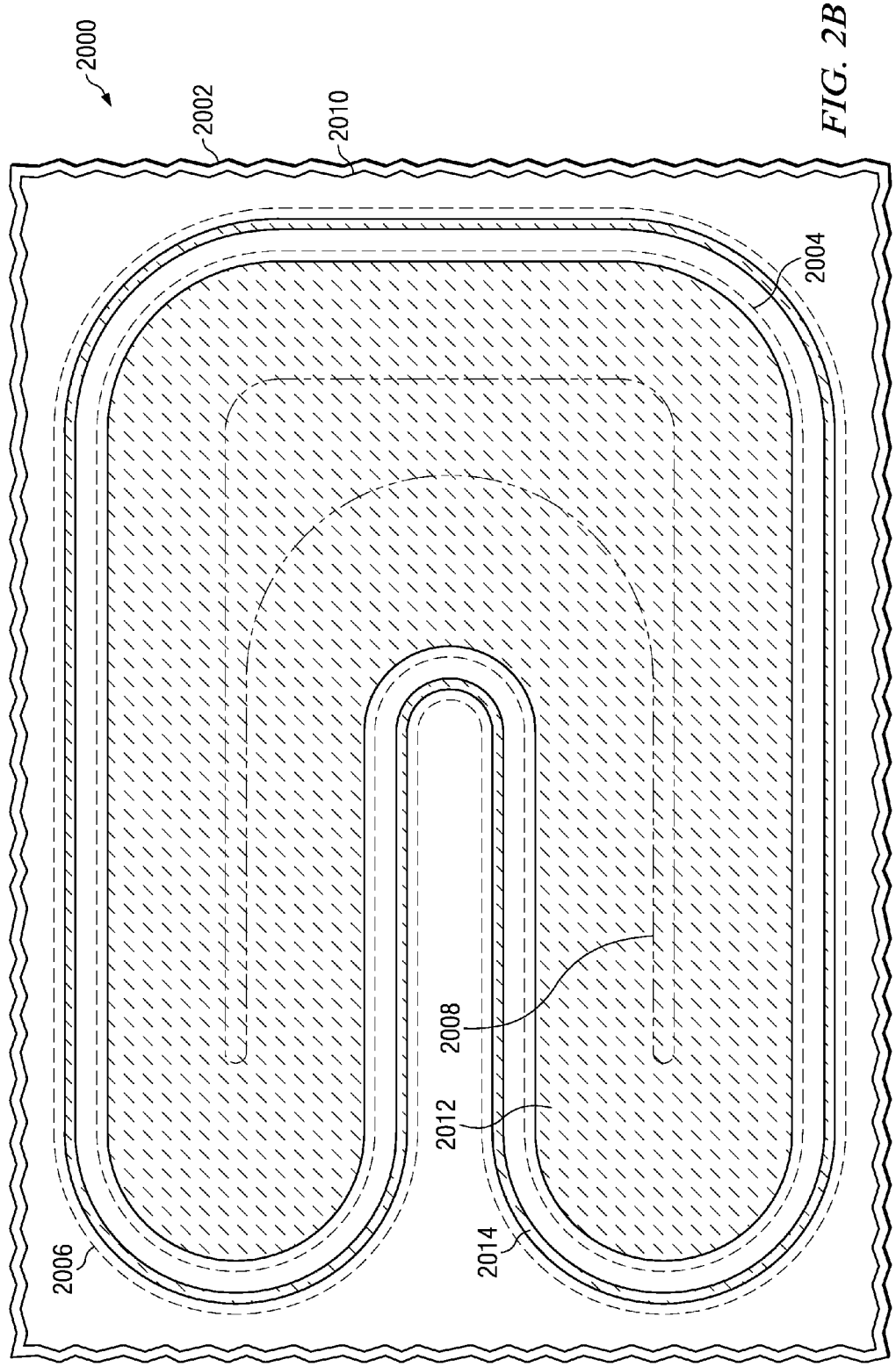

FIG. 2A and FIG. 2B are top views of an integrated circuit containing a dual drift layer extended drain MOS transistor, referred to hereafter as the MOS transistor, formed according to an embodiment, depicted in successive stages of fabrication. The integrated circuit 2000 is formed in and on a substrate 2002 as described in reference to FIG. 1A. A lower drift layer 2004 and a lower drift extension 2006 are formed in the substrate 2002 as described in reference to FIG. 1A and FIG. 1B. In the instant embodiment, the lower drift extension 2006 surrounds the lower drift layer 2004. A drain section 2008 is centrally located in the lower drift layer 2004.

Referring to FIG. 2B, an epitaxial layer 2010 is formed on the substrate 2002 as described in reference to FIG. 1C. An upper drift layer 2012 and an isolation link 2014, are formed in the epitaxial layer 2010 as described in reference to FIG. 1D and FIG. 1E. A body region of the MOS transistor is located in the epitaxial layer 2010 between the upper drift layer 2012 and the isolation link 2014. The body region is electrically isolated from the epitaxial layer 2010 outside the MOS transistor by a combination of the isolation link 2014, the lower drift extension 2006, the lower drift layer 2004 and the upper drift layer 2012. Other configurations of the isolation link 2014, the lower drift extension 2006, the lower drift layer 2004 and the upper drift layer 2012 which electrically isolate the body region are within the scope of the instant invention. Curved portions of the lower drift layer 2004, the lower drift extension 2006, the upper drift layer 2012, and the isolation link 2014 may be configured to reduce an electric field in the lower drift layer 2004, the lower drift extension 2006, the upper drift layer 2012 and the isolation link 2014 to a desired level. Blocking layers in implant masks used to form the lower drift layer 2004, the lower drift extension 2006, the upper drift layer 2012, and the isolation link 2014 may be configured to adjust dilution ratios of doping levels to similarly reduce the electric field in the lower drift layer 2004, the lower drift extension 2006, the upper drift layer 2012 and the isolation link 2014 to a desired level.

Figure 3C:
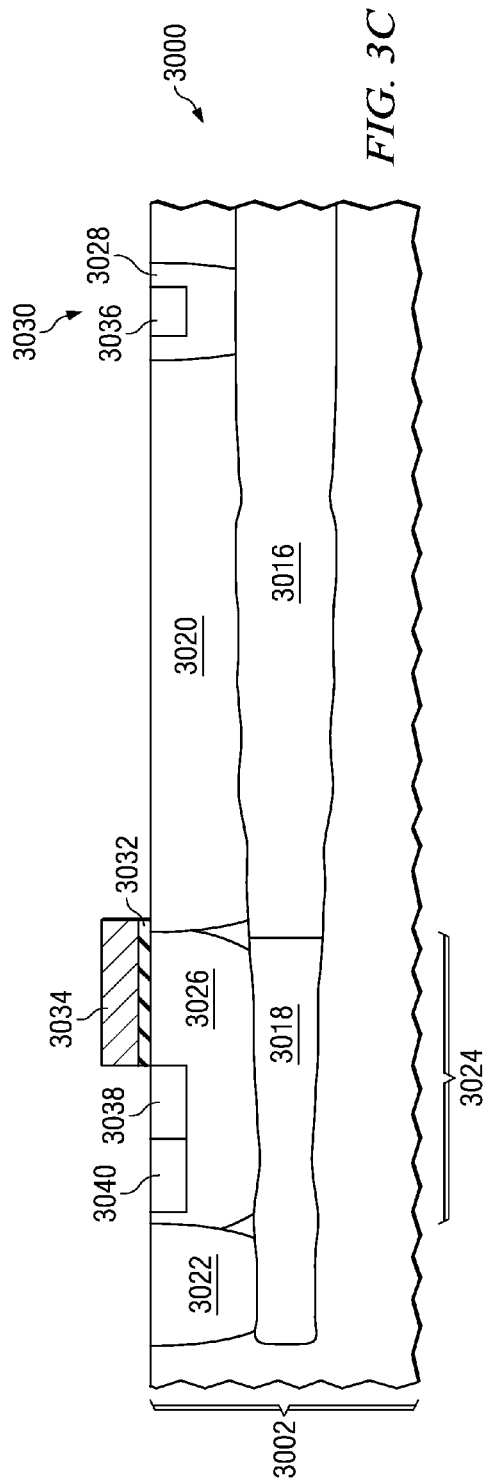

FIG. 3A through FIG. 3C are cross-sections of an integrated circuit containing a dual drift layer extended drain MOS transistor, referred to hereafter as the MOS transistor, formed according to an alternate embodiment, depicted in successive stages of fabrication. Referring to FIG. 3A, the integrated circuit 3000 is formed in and on a monolithic semiconductor substrate 3002 such as a single crystal silicon wafer, a HOT wafer, or other monolithic semiconductor material suitable for fabrication of the integrated circuit 3000. A lower drift layer implant mask 3004 is formed over the monolithic substrate 3002 to expose a top surface of the monolithic substrate 3002 in a lower drift layer area 3006 and possibly in a lower drift extension area 3008. The lower drift layer implant mask 3004 may be segmented in the lower drift layer area 3006 with blocking elements 3010 as depicted in FIG. 3A, or may be free of blocking elements 3010 so as to expose all the top surface of the monolithic substrate 3002 in the lower drift layer area 3006. Similarly, the lower drift layer implant mask 3004 may be segmented with blocking elements 3010 in the lower drift extension area 3008, if formed, as depicted in FIG. 3A, or may be free of blocking elements 3010 so as to expose all the top surface of the monolithic substrate 3002 in the lower drift extension area 3008. The lower drift layer implant mask 3004 may be formed of photoresist, or of dielectric material such as silicon dioxide by patterning and etching a layer of the dielectric material. A lower drift layer ion implant operation is performed on the integrated circuit 3000 which implants n-type lower drift layer dopants through the lower drift layer implant mask 3004 into the monolithic substrate 3002 at a desired depth to form a lower drift layer implanted region 3012 in the lower drift layer area 3006. If blocking elements 3010 are present in the lower drift layer area 3006, the lower drift layer implanted region 3012 may be segmented, as depicted in FIG. 3A. The lower drift layer ion implant operation also forms a lower drift extension implanted region 3014 in the lower drift extension area 3008 if the lower drift layer implant mask 3004 exposes the monolithic substrate 3002 in the lower drift extension area 3008. The lower drift extension implanted region 3014 may also be segmented if blocking elements 3010 are present in the lower drift extension area 3008. The lower drift layer implant mask 3004 may be removed after the lower drift layer ion implant operation is completed.

Referring to FIG. 3B, a lower drift layer anneal operation is performed on the integrated circuit 3000 which heats the monolithic substrate 3002, for example above 1000° C. for at least 60 seconds, so as to diffuse the lower drift layer dopants in the lower drift layer implanted region 3012 to form an n-type lower drift layer 3016 in the lower drift layer area 3006. If the lower drift extension implanted region 3014 was formed, the lower drift layer drive operation diffuses the lower drift layer dopants in the lower drift extension implanted region 3014 to form an n-type lower drift extension 3018 in the lower drift extension area 3008. The lower drift extension 3018, if formed, is continuous with the lower drift layer 3016. Segmenting the lower drift layer implanted region 3012 may reduce a local average doping density in a segmented portion of the lower drift layer 3016 compared to an undiluted portion. Similarly, segmenting the lower drift extension implanted region 3014 may reduce a local average doping density in a segmented portion of the lower drift extension 3018 compared to an undiluted portion. A local average doping density in an undiluted portion of the lower drift layer 3016 may be between $1 \times 10^{16}$ cm$^{-3}$ and $5 \times 10^{17}$ cm$^{-3}$.

Referring to FIG. 3C, an upper drift layer 3020 is formed in the monolithic substrate 3002 contacting the lower drift layer 3016 along at least 75 percent of a common length of the upper drift layer 3020 and the lower drift layer 3016, as described in reference to FIG. 1D and FIG. 1E. If the lower drift extension 3018 is present, an isolation link 3022 is formed to isolate a body region 3024 of the MOS transistor, possibly concurrently with the upper drift layer 3020, as described in reference to FIG. 1D and FIG. 1E. A body well 3026 may be formed in the body region 3024 as described in reference to FIG. 1E. An optional drain link 3028 may be formed in the upper drift layer 3020 at a drain section 3030 of the MOS transistor, as described in reference to FIG. 1F. A gate dielectric layer 3032 and gate 3034 are formed on the body region 3024 as described in reference to FIG. 1F. A drain contact region 3036 is formed in the upper drift layer 3020 in the drain section 3030 of the MOS transistor, and a source region 3038 and a body contact region 3040 are formed in the body region 3024, as described in reference to FIG. 1F.

Figure 4A:
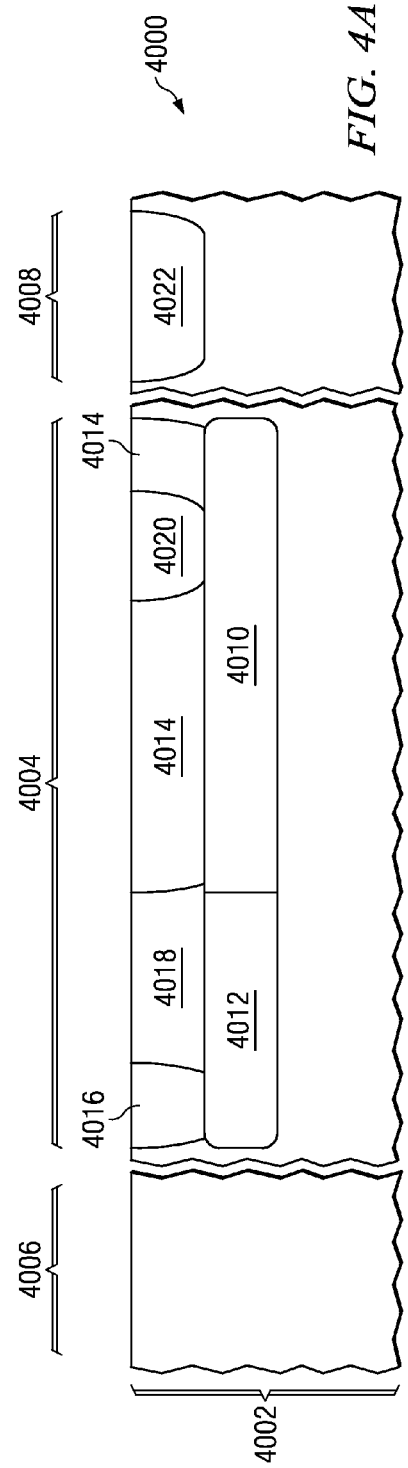
FIG. 4A through FIG. 4C are cross-sections of an integrated circuit containing a dual drift layer extended drain MOS transistor, formed according to an alternate embodiment, depicted in successive stages of fabrication.
Figure 4B:
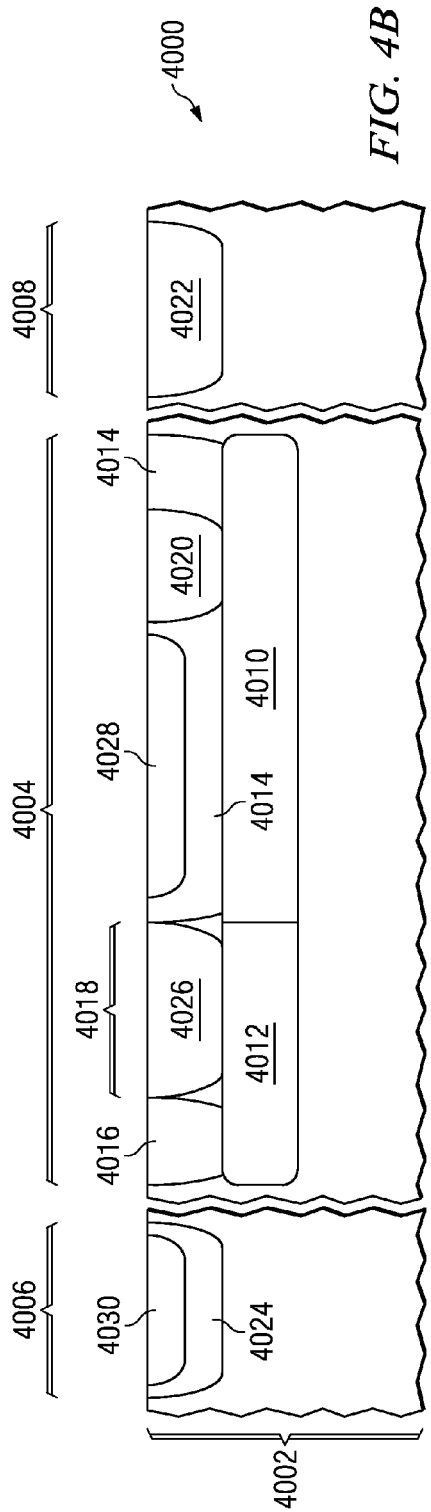
Figure 4C:
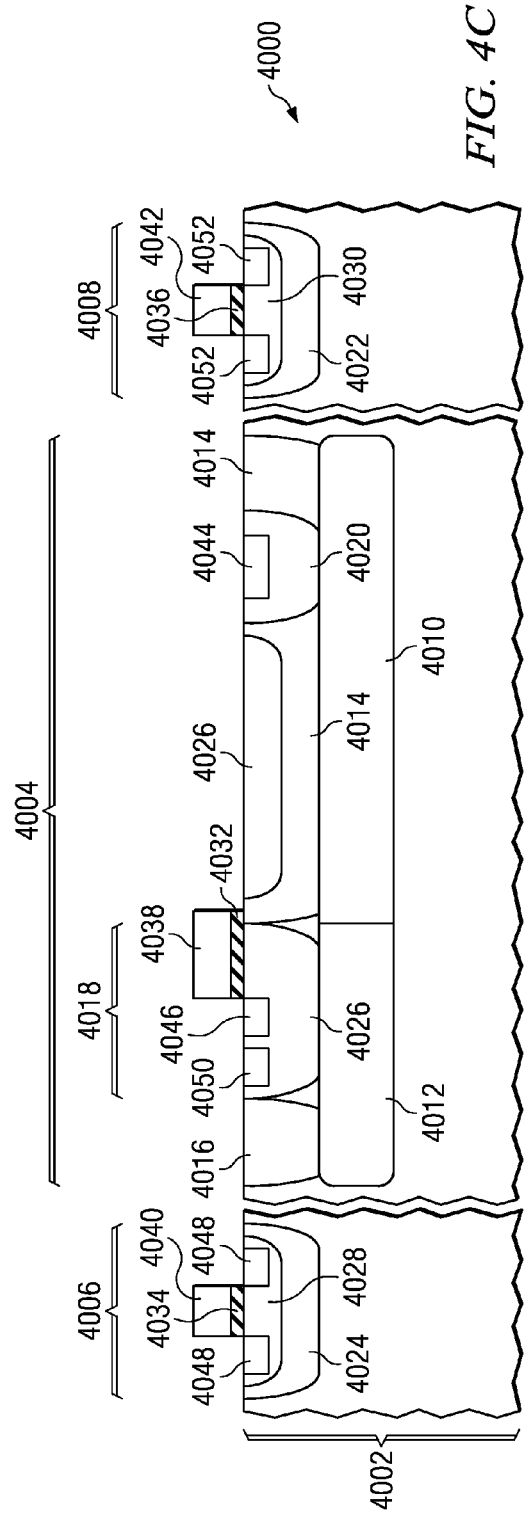

FIG. 4A through FIG. 4C are cross-sections of an integrated circuit containing a dual drift layer extended drain MOS transistor, referred to hereafter as the extended drain MOS transistor, formed according to an alternate embodiment, depicted in successive stages of fabrication. The instant embodiment will be described for an re-channel extended drain MOS transistor; it will be recognized that a p-channel dual drift layer MOS transistor may be fabricated with appropriate changes of polarities of conductivity types and dopants. Referring to FIG. 4A, the integrated circuit 4000 is formed in and on a p-type semiconductor substrate 4002 which may be a combination of a substrate and epitaxial layer as described in reference to FIG. 1A through FIG. 1C, or may be a monolithic substrate as described in reference to FIG. 3A. The integrated circuit includes a first area defined for an n-channel extended drain MOS transistor 4004, a second area defined for a n-channel metal oxide semiconductor (NMOS) transistor 4006, and a third area defined for a p-channel metal oxide semiconductor (PMOS) transistor 4008. An n-type lower drift layer 4010 and an n-type lower drift extension 4012 are formed in the substrate 4002 in the extended drain MOS transistor area 4004, for example as described in reference to FIG. 1A and FIG. 1B, or as described in reference to FIG. 3A and FIG. 3B. An n-type upper drift layer 4014 and an n-type isolation link 4016 are formed in the substrate 4002 contacting the lower drift layer 4010 and the lower drift extension 4012, respectively, as described in reference to FIG. 1D and FIG. 1E. The isolation link 4016, the lower drift extension 4012, the lower drift layer 4010 and the upper drift layer 4014 electrically isolate a body region 4018 from the substrate 4002 outside of the extended drain MOS transistor area 4004.

An optional n-type drain link 4020 may be formed in the upper drift layer 4014 at a drain section in the extended drain MOS transistor area 4004 concurrently with an n-type PMOS body well 4022 formed in the PMOS transistor area 4008. Forming the drain link 4020 concurrently with the PMOS body well 4022 may advantageously reduce a fabrication cost of the integrated circuit 4000.

Referring to FIG. 4B, a p-type NMOS body well 4024 may be formed in the NMOS transistor area 4006. A p-type body well 4026 may be formed in the body region 4018, possibly concurrently with the NMOS body well 4024. An optional p-type upper RESURF layer 4028 may be formed in the upper drift layer 4014 above and not contacting the lower drift layer 4010, concurrently with a p-type NMOS implanted region 4030 in the NMOS transistor area 4006. The NMOS implanted region 4030 may be for example an NMOS threshold adjustment implanted region or an NMOS punch-through blocking implanted region. Forming the upper RESURF layer 4028 concurrently with the NMOS implanted region 4030 may advantageously reduce the fabrication cost of the integrated circuit 4000.

Referring to FIG. 4C, an n-type PMOS implanted region 4030, for example a PMOS threshold adjustment implanted region or a PMOS punch-through blocking implanted region, may be formed in the PMOS transistor area 4008. An extended drain MOS gate dielectric layer 4032 is formed over the body region 4018 as described in reference to FIG. 1F. An NMOS gate dielectric layer 4034 is formed on the substrate 4002 in the NMOS transistor area 4006. A PMOS gate dielectric layer 4036 is formed on the substrate 4002 in the PMOS transistor area 4008. The extended drain MOS gate dielectric layer 4032 may be formed concurrently with the NMOS gate dielectric layer 4034 and/or the PMOS gate dielectric layer 4036 to possibly reduce the fabrication cost of the integrated circuit 4000.

An extended drain MOS gate 4038 is formed on the extended drain MOS gate dielectric layer 4032, an NMOS gate 4040 is formed on the NMOS gate dielectric layer 4034, and a PMOS gate 4042 is formed on the PMOS gate dielectric layer 4036. The extended drain MOS gate 4038 may be formed concurrently with the NMOS gate 4040 and/or the PMOS gate 4042 to possibly reduce the fabrication cost of the integrated circuit 4000.

An n-type drain contact region 4044 is formed in the in the upper drift layer 4014 in the drain section, in the drain link 4020 if present. An n-type source region 4046 is formed in the body region 4018 adjacent to the extended drain MOS gate 4038. N-type NMOS source/drain regions 4048 are formed in the substrate 4002 in the NMOS transistor area 4006 adjacent to the NMOS gate 4040. The drain contact region 4044 and/or the source region 4046 may be formed concurrently with the NMOS source/drain regions 4048 to possibly reduce the fabrication cost of the integrated circuit 4000.

A p-type body contact region 4050 is formed in the body region 4018. P-type PMOS source/drain regions 4052 are formed in the substrate 4002 in the PMOS transistor area 4008 adjacent to the PMOS gate 4042. The body contact region 4050 may be formed concurrently with the PMOS source/drain regions 4052 to possibly reduce the fabrication cost of the integrated circuit 4000.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a semiconductor substrate having a first conductivity type; and
a dual drift layer extended drain metal oxide semiconductor (MOS) transistor, including:
a lower drift layer located in said substrate, said lower drift layer having an opposite conductivity type from said substrate;
an upper drift layer located in said substrate over said lower drift layer, such that:
said upper drift layer contacts said lower drift layer along at least 75 percent of a common length of said upper drift layer and said lower drift layer;
said upper drift layer has said opposite conductivity type from said substrate; and
an average doping density in said lower drift layer is between 2 and 10 times an average doping density in said upper drift layer;
a body region located in said substrate adjacent to said upper drift layer and opposite from a drain section of said dual drift layer extended drain MOS transistor, such that said body region has a same conductivity type as said substrate;
a gate dielectric layer located on said body region and overlapping said upper drift layer; and
a gate located on said gate dielectric layer above said body region and overlapping said upper drift layer.

2. The integrated circuit of claim 1, in which said dual drift layer extended drain MOS transistor further includes:
a lower drift extension located in said substrate under said body region, such that:
said lower drift extension contacts said lower drift layer; and
said lower drift extension has said opposite conductivity type from said substrate; and
an isolation link located in said substrate, such that:
said isolation link has said opposite conductivity type from said substrate; and
said isolation link contacts said lower drift extension so as to electrically isolate said body region from said substrate outside of said dual drift layer extended drain MOS transistor.

3. The integrated circuit of claim 2, in which a doping density of said lower drift extension is diluted so that a local average doping density of said lower drift extension is less than 50 percent of a local doping density of said lower drift layer proximate to said drain section.

4. The integrated circuit of claim 2, in which an average doping density of said isolation link is substantially equal to, or within 25 percent of, an average doping density of said upper drift layer.

5. The integrated circuit of claim 1, in which a doping density of said upper drift layer proximate to said body region is diluted so that a local average doping density of said upper drift layer proximate to said body region is less than 50 percent of a local doping density of said upper drift layer proximate to said drain section.

6. The integrated circuit of claim 1, in which a doping density of said lower drift layer proximate to said body region is diluted so that a local average doping density of said lower drift layer proximate to said body region is less than 50 percent of a local doping density of said lower drift layer proximate to said drain section.

7. The integrated circuit of claim 1, in which:
a local average doping density of said upper drift layer proximate to said drain section is between $5\times10^{15}$ cm$^{-3}$ and $5\times10^{16}$ cm$^{-3}$; and
a local average doping density of said lower drift layer proximate to said drain section is between $1\times10^{16}$ cm$^{-3}$ and $5\times10^{17}$ cm$^{-3}$.

8. The integrated circuit of claim 1, in which said dual drift layer extended drain MOS transistor further includes an upper RESURF layer in said upper drift layer, said upper RESURF layer having said same conductivity type as said substrate.

* * * * *